United States Patent
Magdenko-Savourey et al.

(10) Patent No.: US 10,988,409 B2
(45) Date of Patent: Apr. 27, 2021

(54) PROCESS AND PLANT FOR OBTAINING COLORED GLAZING

(71) Applicant: SAINT-GOBAIN GLASS FRANCE, Courbevoie (FR)

(72) Inventors: Liubov Magdenko-Savourey, Lamorlaye (FR); Rosiana Aguiar, Montigny le Bretonneux (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 199 days.

(21) Appl. No.: 15/781,508

(22) PCT Filed: Dec. 8, 2016

(86) PCT No.: PCT/FR2016/053277
§ 371 (c)(1),
(2) Date: Jun. 5, 2018

(87) PCT Pub. No.: WO2017/098166
PCT Pub. Date: Jun. 15, 2017

(65) Prior Publication Data
US 2018/0273423 A1 Sep. 27, 2018

(30) Foreign Application Priority Data
Dec. 9, 2015 (FR) ...................................... 1562045

(51) Int. Cl.
*C23C 14/34* (2006.01)
*C03C 17/00* (2006.01)
(Continued)

(52) U.S. Cl.
CPC .......... *C03C 17/007* (2013.01); *C03C 17/002* (2013.01); *C03C 17/008* (2013.01);
(Continued)

(58) Field of Classification Search
CPC ............ C23C 14/0015; C23C 14/0057; C23C 14/0688; C23C 14/34; C23C 14/3464;
(Continued)

(56) References Cited

U.S. PATENT DOCUMENTS 5,876,854 A 3/1999 Kawazu et al.
5,976,678 A 11/1999 Kawazu et al.
(Continued)

FOREIGN PATENT DOCUMENTS

CN 104120394 A 10/2014
EP 1679291 * 7/2006
(Continued)

OTHER PUBLICATIONS

Kim et al. "Tunable aggregation of Au nanoparticles in Au/SiO2 composite film and its photo-absorbance", Appl. Phys. A 92, 263-266 (2008). (Year: 2008).*

(Continued)

*Primary Examiner* — Rodney G McDonald
(74) *Attorney, Agent, or Firm* — Oblon, McClelland, Maier & Neustadt, L.L.P.

(57) ABSTRACT

A process for depositing a coating on a glass substrate includes co-sputtered simultaneously by a plasma, in one and the same chamber of the vacuum deposition device, a first constituent made of a material consisting of an oxide, a nitride or an oxynitride of a first element and a second constituent consisting of the metallic form of a second element. The process also includes introducing a hydride, a halide or an organic compound of a third element, different than the first element, into the plasma, to recover the substrate covered with the coating comprising the first, second and third elements at the outlet of the device. The coating consists of metal nanoparticles of the second element dispersed in an inorganic matrix of the first and third elements. The coating displays a plasmon absorption peak in the visible region.

14 Claims, 1 Drawing Sheet

(51) Int. Cl.
  *C23C 14/00* (2006.01)
  *C23C 14/06* (2006.01)
  *C23C 14/58* (2006.01)
  *C03C 17/09* (2006.01)
  *C03C 17/245* (2006.01)

(52) U.S. Cl.
  CPC .......... *C03C 17/09* (2013.01); *C03C 17/2456* (2013.01); *C23C 14/0015* (2013.01); *C23C 14/0057* (2013.01); *C23C 14/0688* (2013.01); *C23C 14/5806* (2013.01); *C03C 2217/45* (2013.01); *C03C 2217/479* (2013.01); *C03C 2217/48* (2013.01); *C03C 2217/485* (2013.01); *C03C 2218/153* (2013.01); *C03C 2218/155* (2013.01); *C03C 2218/156* (2013.01); *C03C 2218/32* (2013.01)

(58) Field of Classification Search
  CPC .......... C23C 14/5806; C03C 2218/156; C03C 2218/32; C03C 2218/153; C03C 2218/155; C03C 2217/45; C03C 2217/479; C03C 2217/48; C03C 2217/485; C03C 17/007; C03C 17/002; C03C 17/008; C03C 17/09; C03C 17/2456
  USPC ............. 204/192.12, 192.26, 192.27, 192.28
  See application file for complete search history.

(56) References Cited

U.S. PATENT DOCUMENTS

| | | | |
|---|---|---|---|
| 2001/0018393 A1 | 8/2001 | Nagashima et al. | |
| 2005/0040034 A1* | 2/2005 | Landgraf | C23C 16/44 204/192.38 |
| 2007/0108043 A1* | 5/2007 | Lu | C23C 14/3414 204/192.15 |
| 2015/0325418 A1 | 11/2015 | Gil Rostra et al. | |

FOREIGN PATENT DOCUMENTS

| | | |
|---|---|---|
| ES | 2 263 184 T3 | 12/2006 |
| JP | 2013-237910 * | 11/2013 |
| RU | 2 341 587 C2 | 12/2008 |
| RU | 2 420 607 C1 | 6/2011 |
| WO | WO 98/33077 A2 | 7/1998 |
| WO | WO 2010/106370 A1 | 9/2010 |

OTHER PUBLICATIONS

Belmonte et al. "PVD-PECVD hybrid processes: Synthesis of composite thin films and process understanding", Key Engineering Materials Online: Mar. 7, 2008 ISSN: 1662-9795, vols. 373-374, pp. 93-99 (Year: 2008).*
Sasaki et al., Preparation of M/TiO2 (M=Au, Pt) Nanocomposite films using co-sputtering method, Nanostructured Materials, vol. 12, pp. 511-514, 1999. (Year: 1999).*
Machine Translation EP 1679291 dated Jul. 2006. (Year: 2006).*
Machine Translation JP 2013-237910 (Year: 2013).*
Chan, K. et al., "Effect of rapid thermal annealing time on Au/SiO$_x$ film prepared by hot wire assisted plasma enhanced chemical vapour deposition technique", Materials Chemistry and Physics, vol. 140, No. 1, XP 028534003, 2013, pp. 37-41.
Beyene, H. et al., "Plasma-Assisted Deposition of Au/SiO$_2$ Multilayers as Surface Plasmon Resonance—Based Red-Colored Coatings", Plasmonics, vol. 6, No. 2, XP 019902956, 2011, pp. 255-260.
Jung, M. "Synthesis and Structural Analysis of Au-Doped TiO$_2$/SiO$_2$ Mixed Oxide Films Prepared by Sol-Gel Process", Journal of Sol-Gel Science and Technology, vol. 19, XP 019212706, 2000, pp. 563-568.
Daniel, A. et al., "Description of a hybrid PECVD-PVD process: Application to Zn—Si—O and Ti—Si—O composites thin films", Applied Surface Science, vol. 253, No. 24, XP 022241134, 2007, pp. 9323-9329.

* cited by examiner

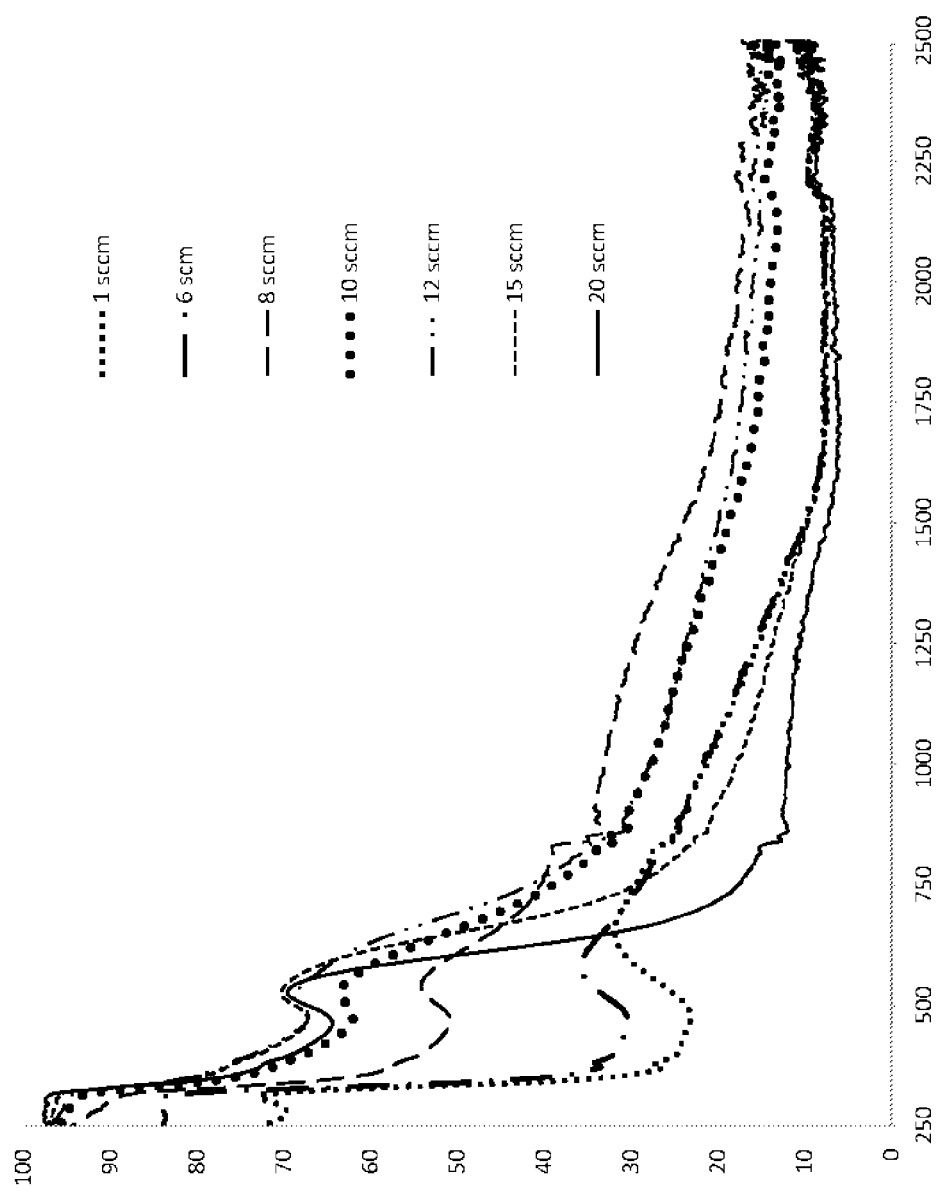

PROCESS AND PLANT FOR OBTAINING COLORED GLAZING

The present invention relates to a method and a piece of equipment in the field of surface treatment of a glass substrate for depositing thereon a coating that endows it with a suitable coloration, without having to add additional metal oxides to the initial composition of the glass. In general, said treatment aims to modify the surface appearance of glazing, in particular of colorless flat glass resulting from an industrial process of the float glass type, to endow it with a coloration after it has been formed, simply by depositing a thin-layer coating, said coating consisting of a material that has a plasmon absorption peak in the visible region.

In the field of glazing for buildings, much research has been devoted to the development of innovative glazing with various properties: glazing for controlling sunlight, self-cleaning glazing, or colored glass. Increasingly, there has also been research into glazing that combines several properties, and in particular colored glazing having one or more functionalities such as control of sunlight, thermal insulation (low-emission glazing), electromagnetic shielding, heating, hydrophilic or hydrophobic functions, photocatalytic (self-cleaning glazing), modification of the level of reflection in the visible (anti-reflective or mirror glazing).

When we wish to obtain colored glass, the existing industrial process consists of adding pigments—generally metal oxides—to the float glass melting bath. During glass-making, various metal oxides may thus be used depending on the desired final color for the glazing: CuO for a red color, MnO for violet, or CoO for blue. This gives glass that is colored in its bulk.

Although this method is relatively simple to implement, it has a major drawback. The use of pigments during glass-making contaminates the melting bath and means that a particular color must be manufactured in a specific bath.

In particular, a color change always requires the manufacture of a transitional glass: a large amount of glass is thus lost until the desired color is obtained. This involves a substantial loss at the production level, as well as of the equipment productivity, finally with an appreciable increase in cost of the glazing if we wish to alter its color. This method therefore lacks flexibility for adapting to customers' constantly changing requirements.

An advantageous solution allowing greater flexibility in the production of colored glass consists of depositing a coating thereon in layer(s), and in this case the colorimetric characteristics of said coating can easily be adjusted and modified.

The aim of the present invention is thus, according to a first aspect, to propose a simple method and a piece of equipment for implementing it, said method making it possible to deposit such a coating whose colorimetry is easily adjustable.

As is known, a substrate may be coated in the vapor phase with one or more thin layers of a specified material by several different techniques:

According to a first method called pyrolysis, the precursors of the products to be deposited, supplied in gaseous, liquid or solid form, are decomposed on the hot substrate (T>500° C.). In the case of gaseous precursors, the method is designated AP-CVD (Atmospheric Pressure Chemical Vapor Deposition) or more generally thermal CVD. The present invention does not relate to such processes.

According to a second method of deposition, processes called cathode sputtering or "magnetron sputtering" are used, which consist of carrying out deposition in ultrahigh vacuum under a magnetic field, by sputtering the material or a precursor of the material to be deposited. An embodiment example of such a device is described for example in U.S. Pat. No. 6,214,183.

A third method has been described, which was developed originally in the microelectronics field and is called PE-CVD (for Plasma Enhanced Chemical Vapor Deposition). According to this method, instead of using a target made of the material to be deposited, precursors of the latter are injected in the form of a gas and are decomposed in the electric discharge of the plasma. This process is generally carried out at pressures ranging from 10 mtorr to 500 mbar (1 torr=133 Pa, 1 bar=0.1 MPa). The substrate is generally used at room temperature or heated to relatively low temperatures (for example below 350° C.) to provide the mechanical properties and properties of adherence of the deposited layer. Owing to the moderate temperature to which the substrate is subjected, this technique may be used for coating substrates that are sensitive to temperature, for example consisting of plastics. A process of this kind is described for example in application EP 0 149 408.

The processes of magnetron sputtering and to a lesser extent PE-CVD have to be carried out in a piece of equipment under vacuum and therefore, taken individually, have very limited flexibility.

As noted above, one of the aims of the present invention is to rectify the problems described above, by proposing a manufacturing process that can be modulated and that allows quick, flexible adaptation of the colorimetry required for glazing, and moreover said method is economical and does not lead to appreciable loss of production of float glass.

According to the present invention, a process is described that combines the principles of magnetron sputtering and of PE-CVD, for depositing a coating on a substrate that is in principle initially colorless (often called clear glass in the trade), to endow it with an adaptable color.

Application of the present invention offers several advantages. Firstly, the coloration is produced completely independently of manufacture of the glass, which is in principle colorless according to the invention (colorless glass). Thus, the glass may be manufactured without having to define its coloration in advance. The thin layers also make it possible to obtain colored glass in small quantities; the present process is thus much more flexible and adaptable to demand. Owing to the present invention, it becomes possible to produce layers of different colors and in different proportions, without intermediate losses of large quantities of glass.

Deposition processes are known that make it possible to produce stacks of layers mainly consisting of metal nanoparticles and dielectric layers, by techniques called magnetron sputtering of a target under vacuum. For example, the publication "Preparation and optical characterization of Au/SiO2 composite films with multilayer structure, H. B. Liao, Weijia Wen, G. K. L. Wong, Journal of Applied Physics, 2003, Vol. No. 93, 4485" describes the fabrication of an $SiO_2$/Au stack that absorbs a wavelength of around 530 nm and has a red color in transmission.

Application WO2010/106370 describes a method for depositing a coating on a substrate, in which a solution of a precursor is deposited by CVD, AP-CVD or else pyrolysis on a substrate heated to 330-370° C., to obtain a matrix film of tin oxide, titanium oxide or zinc oxide doped with aluminum, in which gold nanoparticles are incorporated. Said process does not seem flexible enough, nor is it suitable for application on an industrial scale, in particular for coloring glass of large dimensions on flat glass substrates obtained by a float process, which often have a width of the order of several meters.

The present process provides simple and economical production of coatings in colored layers, which absorb the incident visible radiation according to a wavelength that is easily adjustable, consisting of metal nanoparticles embedded in a dielectric, in particular oxide, matrix.

More particularly, the present invention relates to a process for depositing a coating on a glass substrate in order to modify its colorimetry, said process being characterized in that it comprises at least the following steps:
a) passing said substrate through a device for vacuum deposition by cathode sputtering,
b) introducing a gas into said vacuum deposition device and generating a plasma from said gas,
c) simultaneously sputtering, in one and the same chamber of the vacuum deposition device,
    a first constituent made of a material consisting of an oxide, a nitride or an oxynitride of a first element, preferably an oxide of the first constituent, and
    a second constituent consisting of the metallic form of a second element,
said co-sputtering being obtained by means of said plasma,
d) introducing a hydride, a halide or an organic compound of a third element, different than the first element, into said plasma,
e) recovering said substrate, covered with said coating comprising said first, second and third elements, at the outlet of the device, said coating consisting of metal nanoparticles of the second element dispersed in an inorganic matrix of said first and third elements, in particular in the form of an oxide, a nitride or an oxynitride of said first and third elements, said coating displaying a plasmon absorption peak in the visible region,
or
e') recovering said substrate covered with said coating comprising said first, second and third elements at the outlet of the device and heating the whole to a suitable temperature (preferably above 400° and below the softening point of the glass) and for a sufficient time to obtain a coating consisting of metal nanoparticles of the second element dispersed in an inorganic matrix of said first and third elements, in particular in the form of an oxide, a nitride or an oxynitride of said first and third elements, said coating displaying a plasmon absorption peak in the visible region.

The present invention thus relates to a process for depositing a coating on a glass substrate, said process comprising a step in which a first constituent made of a material consisting of an oxide, a nitride or an oxynitride (preferably an oxide) of a first element and of a second constituent consisting of the metallic form of a second element are co-sputtered simultaneously by a plasma, in one and the same chamber of the vacuum deposition device. According to the invention, a hydride, a halide or an organic compound of a third element, different than the first element, is introduced into said plasma, so as to recover said substrate covered with a coating comprising said first, second and third elements at the outlet of the device. According to the invention, said coating thus obtained consists of metal nanoparticles of the second element dispersed in an inorganic matrix of said first and third elements and it displays a plasmon absorption peak in the visible region, which imparts a final coloration to the glazing thus obtained, said final coloration being obtainable by means of an additional step of thermal treatment, if necessary.

Said coloration is easily adjustable, in particular by modifying the conditions of said sputtering, and in particular by varying the amount of the precursor of the third element introduced into the plasma.

According to particular, preferred embodiments of the present invention, which may of course be combined with one another:
The first element is selected from titanium, zirconium, tin, indium, aluminum, tin or silicon, zinc.
The third element, different than the first element, is selected from titanium, zirconium, tin, indium, aluminum, tin or silicon, zinc.
The first, second and third elements are different than one another.
The first constituent comprises, comprises essentially, or consists of an oxide of the first element.
The inorganic matrix is an oxide of said first and third elements.
The second element is selected from the group consisting of: Ag, Au, Ni, Cr, Cu, Pt, Pd, preferably it is selected from Ag, Ni, Cu, more preferably from Ag or Au.
The plasma gas is a neutral gas selected from argon, krypton or helium.
A reactive gas comprising oxygen and/or nitrogen, in particular dioxygen and/or dinitrogen, is mixed with the neutral gas and introduced into the device.
According to a first possible embodiment, step c) comprises the sputtering, in said device for vacuum deposition by cathode sputtering, of a target comprising parts consisting of a mixture of an oxide, a nitride or an oxynitride of the first constituent, preferably an oxide of the first constituent, and parts consisting of the metal of the second element.
The metallic form of the second constituent, according to this embodiment, represents between 10% and 40% of the total weight of the target.
According to a possible but less preferred alternative embodiment, step c) comprises the sputtering, in said device for vacuum deposition by cathode sputtering, of a first target consisting of an oxide, a nitride or an oxynitride of the first constituent, preferably an oxide of the first constituent, and of a second target consisting of the metal of the second element.
The first constituent is a titanium oxide, and said second constituent is selected from the group consisting of Au, Cu, Ag, or Ni in which the neutral gas is argon, mixed with oxygen and in which the second element is silicon. According to this embodiment, the second element may advantageously be introduced into said device in the form of a silicon organometallic compound, preferably TEOS or HMDSO.
The process comprises, in step e), heating the substrate to a temperature above 400° and below the softening point. Such heating is employed in particular if it is useful or necessary for improving the coating's absorption in the visible region by the plasmon effect.
The thickness of the coating is between 10 and 70 nm, in particular between 15 and 50 nm.

The invention also relates to glazing obtainable by the process described above and comprising a glass substrate on which a coating is deposited, said coating consisting of a material consisting of nanoparticles dispersed in an inorganic matrix of an oxide, a nitride or an oxynitride of at least two different elements, said material displaying a plasmon absorption peak in the visible region.

In particular, in said glazing that is preferred according to the invention:

The two elements are selected from the group consisting of titanium, zirconium, tin, zinc or silicon and the metal nanoparticles consist of at least one element selected from the group consisting of: Ag, Au, Ni, Cr, Cu, Pt, Pd, more preferably from Ag, Ni or Au, more preferably from Ag or Au.

The metal nanoparticles represent between 1 and 15% of the total weight of the material constituting the coating, preferably between 2 and 10% of the total weight of the material constituting the coating and very preferably between 2 and 5% of the total weight of the material constituting the coating.

The thickness of the coating is between 10 and 70 nm, in particular between 15 and 50 nm.

The first element is silicon and the second element is selected from the group consisting of silicon, zirconium, tin, indium, zinc, titanium and the metal nanoparticles consist of at least one element selected from the group consisting of: Ag, Au, Ni, Cr, Cu, Pt, Pd, more preferably from Ag, Cu, Ni or Au, more preferably from Ag or Au. Preferably, according to this embodiment, the third element is silicon.

The first element is titanium and a second element is selected from the group consisting of silicon, zirconium, tin, indium, zinc, and the metal nanoparticles consist of at least one element selected from the group consisting of: Ag, Au, Ni, Cr, Cu, Pt, Pd, more preferably from Ag, Cu, Ni or Au, more preferably from Ag or Au. Preferably, according to this embodiment, the second element is titanium.

Moreover, the invention relates to a piece of equipment for carrying out the process described above.

According to a first embodiment, said piece of equipment comprises, in combination:

a cathode sputtering device comprising at least one chamber under vacuum, a target consisting of a mixture of a first constituent made of a dielectric material consisting of an oxide, a nitride or an oxynitride of a first element and of a second constituent consisting of the metallic form of a second element, said target being set up in the chamber under vacuum, means for sputtering said target comprising means for introducing a plasma gas and means for generating a plasma from said gas, said plasma serving for sputtering said target, means for introducing, into said plasma, a third element different than the first element, in the form of a hydride, a halide or an organic compound of said third element, means for passing the substrate through said device, at a suitable speed for depositing, on a surface thereof, a layer of a coating consisting of metal nanoparticles of the second element dispersed in an inorganic matrix of an oxide, a nitride or an oxynitride of said first and third elements, means for recovering said substrate covered with said coating at the outlet of the device.

According to a second embodiment, said piece of equipment comprises, in combination:

a cathode sputtering device comprising at least one chamber under vacuum, a first target consisting of a mixture of a first constituent made of a dielectric material consisting of an oxide, a nitride or an oxynitride of a first element, said first target being set up in the chamber under vacuum, a second target made of a second constituent consisting of the metallic form of a second element, said second target being set up in the chamber under vacuum, means for simultaneous co-sputtering of the two targets comprising means for introducing a plasma gas and means for generating a plasma from said gas, said plasma serving for the sputtering of said targets, means for introducing, into said plasma, a third element different than the first element, in the form of a hydride, a halide or an organic compound of said element, means for passing the substrate through said device, at a suitable speed for depositing, on a surface thereof, a layer of a coating consisting of metal nanoparticles of the second element dispersed in an inorganic matrix of an oxide, a nitride or an oxynitride of said first and third elements, means for recovering said substrate covered with said coating at the outlet of the device.

Finally, the invention relates to the use of a piece of equipment as described above for the manufacture of colored glass substrates comprising a coating consisting of metal nanoparticles of the second element dispersed in an inorganic matrix of an oxide, a nitride or an oxynitride of said first and third elements.

According to the invention, to create the plasma, the cathode may be supplied with an RF (radiofrequency) supply or a DC (direct current) supply, optionally pulsed, or else an AC (alternating current) supply. As is known, an RF supply normally supplies an alternating current of 13.56 MHz. Use of this supply requires a tuner for tuning the signal generated to the target.

In practice, for sputtering a target that has little or no conductivity, an RF supply will preferably be used.

According to the deposition process according to the invention, it is also possible, or even preferred, to use a DC supply, which makes it possible to obtain a higher rate of sputtering, or avoid fouling of the cathode by the compounds injected into the chamber.

BRIEF DESCRIPTION OF THE DRAWING

The FIGURE shows the absorption spectra in the visible range of glazing obtained according to the examples (wavelength in nanometers on the abscissa).

The invention, its various aspects and its advantages will be better understood on reading the nonlimiting examples given hereunder, supplied purely for purposes of illustration.

In these examples, the aim is to deposit, by the process of the invention, a colored layer consisting of a matrix of oxides of the elements Ti and Si, in which metal particles of gold are dispersed.

Deposition of the colored layers according to the invention is carried out in a cathode sputtering housing of the magnetron type delimiting a chamber in which an ultrahigh vacuum can be created. In this housing (constituting the anode), the target (constituting the cathode) is installed in the chamber in such a way that during deposition, an RF or DC supply allows a plasma to be generated from a plasma gas, most often argon, krypton or helium, in front of the target, with the substrate travelling parallel to this target. With this setup, it is possible to select the speed of travel of the substrate and therefore the deposition time and the thickness of the layer.

For the target according to the invention, a commercial titanium oxide target (TiOx) is used initially. Pellets of metallic gold are fixed (for example by gluing with a silver adhesive) and regularly spaced on the titanium oxide target to constitute the two-constituent target according to the invention, in such a way that the plasma sputters the two constituents of said target simultaneously.

The power required for generating a plasma from the gas in the device is applied to the cathode. For jointly depositing the element Si on the glass substrate, an organometallic precursor of silicon, HMDSO (hexamethyldisiloxane), is injected into the plasma that has been generated. Deposition takes place under an atmosphere essentially of argon (neutral plasma gas) and a small proportion of dioxygen in the chamber of the housing. More precisely, for all the examples given below, the flow rate of argon injected into the chamber is 25 sccm (standard cubic centimeters per minute) and the flow rate of oxygen injected into the chamber is 10 sccm. The deposition time is about 6 minutes for all the examples. The thickness of the layers thus obtained varies between 10 and 30 nm.

Several layers are deposited according to the same principles, varying the flow rate of the silicon precursor in order to obtain different dielectric matrixes consisting of a mixed oxide of titanium and silicon, in which the ratio of the two elements Si and Ti is adjusted as shown in Table 1 below. Varying said ratio provides variation of the refractive index of the dielectric matrix as well as of the thickness of the layer deposited. Finally, by measuring the refractive index of the coating obtained, it is possible to estimate the amount of silicon present in the material making up said coating (the deposited layer), with a measured index of 2.4 corresponding to a material whose composition is close to $TiO_2$, and a measured index of about 1.5 corresponding to a material whose composition is close to $SiO_2$. Table 1 below presents the main parameters of the step of depositing the coating layer according to the present process.

TABLE 1

| Example | Argon (sccm) | $O_2$ (sccm) | HMDSO (sccm) | Power (W) | Total pressure (µbar) | Deposition time (min) |
|---|---|---|---|---|---|---|
| 1 | 25 | 10 | 1 | 500 | 3.47 | 6 |
| 2 | 25 | 10 | 6 | 500 | 3.6 | 6 |
| 3 | 25 | 10 | 8 | 500 | 3.66 | 6 |
| 4 | 25 | 10 | 9 | 500 | 3.68 | 6 |
| 5 | 25 | 10 | 10 | 500 | 3.7 | 6 |
| 6 | 25 | 10 | 12 | 500 | 3.74 | 6 |
| 7 | 25 | 10 | 15 | 500 | 3.82 | 6 |
| 8 | 25 | 10 | 20 | 500 | 4.10 | 6 |

After deposition, the substrates provided with the various coatings are annealed at 650° C. in air at normal pressure.

For each example, the properties of the coatings thus deposited are then measured according to the following protocols:

Optical spectra of the samples were recorded using a Lambda 900 spectrophotometer over the wavelength range from 250 nm to 2500 nm. Measurements were carried out in transmission on the layer side and in reflection on the glass side and the layer side. The absorption spectrum and the possible presence of a plasmon absorption peak are deduced from the measurements using the following relation: A=100−T−R (layer side).

The colorimetric properties of the layers were also measured using the above device on the glazing obtained (layer side). The values L*, a* and b* (International System), which characterize the color rendering, are measured from the spectrum obtained.

The refractive indices and the thicknesses of the material constituting the coatings deposited in the form of a thin layer were measured by the classical techniques of ellipsometry using a variable angle ellipsometer (VASE).

For each of the examples, the results obtained are presented in Table 2 below.

Moreover, the appended figure shows the absorption spectra in the visible of the glazing obtained according to the preceding examples (wavelength given in nanometers on the abscissa).

TABLE 2

| Example | Refractive index | HMDSO (sccm) | Colorimetry | Position of plasmon peak | Perceived color |
|---|---|---|---|---|---|
| 1 | 2.10 | 1 | L* = 80.3<br>a* = −5.9<br>b* = −3.9 | 650 nm | Cyan |
| 2 | 1.80 | 6 | L* = 55.7<br>a* = −5.0<br>b* = −10 | 580 nm | Light blue |
| 3 | 1.69 | 8 | L* = 54.8<br>a* = −2.2<br>b* = −12.1 | 550 nm | Sky-blue |
| 4 | 1.65 | 9 | L* = 52.4<br>a* = −0.6<br>b* = −11.9 | 540 nm | Indigo |
| 5 | 1.63 | 10 | L* = 44.9<br>a* = 1.80<br>b* = −14.4 | 525 nm | Indigo |
| 6 | 1.59 | 12 | L* = 37.7<br>a* = 0.4<br>b* = −21.3 | 520 nm | Midnight blue |
| 7 | 1.54 | 15 | L* = 41.8<br>a* = 8.7<br>b* = −19.8 | 520 nm | Violet |
| 8 | 1.54 | 20 | L* = 53.6<br>a* = 18.3<br>b* = −10.6 | 520 nm | Magenta |

The results presented in Table 2 above show the advantages connected with the present invention. In particular, surprisingly, and not previously described, according to a process according to the invention, simple control of the flow rate of HMDSO (precursor of the element silicon) injected during deposition provides control of the final colorimetry of the glazing.

According to the process according to the invention, it is thus possible to control perfectly, and vary over a wide range, the color of glazing very easily and economically, without loss of production.

In particular, simply by depositing a coating layer, it is possible according to the invention, by simple adjustment of the flow rate of the precursor gas in the device according to the invention, to alter the coloration of the final glazing (substrate covered with the coating) quickly and without any difficulty, with a color varying from cyan to various shades and intensities of blue, as well as violet or magenta hues.

Results of the same kind were observed when pellets of metallic silver were used on the TiOx target instead of gold pellets, and various further colorations were obtained by such replacement.

As an example, we may also mention the following possible combination: a target of silicon oxide comprising a small amount of aluminum (for example between 4 and 12 mol % of aluminum, based on the amount of silicon present) and a titanium precursor such as TiPT (titanium tetraisopropoxide), the second constituent of the target being selected from the group of metals consisting of Ag, Au, Ni, Cr, Cu, preferably being selected from Ag, Au.

Of course, according to the invention, it is possible to deposit other layers or other stacks on top (by reference to the glass substrate), or even underneath, the colored coating according to the invention, to endow the glazing with additional functionality, for example control of sunlight, low-emission, electromagnetic shielding, heating, hydrophilicity, hydrophobicity, photocatalysis, antireflective or mirror, electrochromic glass, electroluminescence, photovoltaic.

According to a preferred embodiment of the invention, a protective layer of dielectric material for increasing the mechanical and/or chemical durability of said coating, for example of silicon nitride or silicon oxide, or else of titanium oxide, is deposited on top of the colored coating according to the invention, or even underneath the colored coating. The thickness of this protective layer may be for example of the order of 1 to 15 nm, or even from 1 to 10 nm, or even from 1 to 5 nm.

The invention claimed is:

1. A process for depositing a coating on a glass substrate and controlling the final colorimetry of the coating deposited on the glass substrate, said process comprising the following successive steps:
   a) passing said glass substrate through a device for vacuum deposition by cathode sputtering,
   b) introducing a gas into said device for vacuum deposition and generating a plasma from said gas,
   c) co-sputtering simultaneously, in one and the same chamber of the vacuum deposition device,
      a first constituent made of a material consisting of an oxide, a nitride or an oxynitride of a first element and
      a second constituent consisting of the metallic form of a second element,
   said co-sputtering being obtained by means of said plasma,
   d) introducing a flow of a hydride, a halide or an organic compound of a third element, which third element is selected from the group consisting of titanium, zirconium, tin, indium, aluminum, silicon, and zinc and is different than the first element, into said plasma, and
   e) recovering said glass substrate, covered with said coating comprising said first, second and third elements, at an outlet of the device, said coating consisting of metal nanoparticles of the second element dispersed in an inorganic matrix of said first and third elements, said coating displaying a plasmon absorption peak in the visible region,
   or
      recovering said substrate covered with said coating comprising said first, second and third elements at an outlet of the device and heating the substrate covered with said coating at a suitable temperature and for a sufficient time to obtain a coating consisting of metal nanoparticles of the second element dispersed in an inorganic matrix of said first and third elements, said coating displaying a plasmon absorption peak in the visible region;

wherein the final colorimetry of the coating on the glass substrate is controlled by adjusting the rate of flow of the hydride, halide or organic compound of the third element introduced into said plasma.

2. The process as claimed in claim 1, in which, during step e), the suitable temperature is above 400° and below the softening point of the glass.

3. The process as claimed in claim 1, in which the inorganic matrix is an oxide, a nitride or an oxynitride of said first and third elements.

4. The process as claimed in claim 1, in which the first element is selected from titanium, zirconium, tin, indium, aluminum, silicon, or zinc.

5. The process as claimed in claim 1, in which the third element is selected from the group consisting of titanium, zirconium, tin, indium, aluminum, and zinc.

6. The process as claimed in claim 1, in which the first constituent is an oxide of the first element.

7. The process as claimed in claim 1, in which the second constituent is selected from the group of metals consisting of: Ag, Au, Ni, Cr, Cu, Pt, and Pd.

8. The process as claimed in claim 1, in which the gas introduced into said device for vacuum deposition is a neutral gas selected from argon, krypton or helium.

9. The process as claimed in claim 8, in which a reactive gas comprising oxygen and/or nitrogen, is mixed with the neutral gas and introduced into the device.

10. The process as claimed in claim 1, in which step c) comprises co-sputtering, in said device for vacuum deposition by cathode sputtering, of a target comprising parts consisting of a mixture of an oxide, a nitride or an oxynitride of the first constituent and parts consisting of the metallic form of the second constituent.

11. The process as claimed in claim 1, in which step c) comprises co-sputtering, in said device for vacuum deposition by cathode sputtering, of a first target consisting of an oxide, a nitride or an oxynitride of the first constituent and of a second target consisting of the metallic form of the second constituent.

12. The process as claimed in claim 1, in which the first constituent is a titanium oxide, in which said second constituent is selected from the group consisting of Au, Ni, Cu, and Ag, in which the gas introduced into said device for vacuum deposition is argon mixed with oxygen, in which the third element is silicon, and in which the organic compound of the third element is an organometallic silicon compound.

13. The process as claimed in claim 1, which comprises recovering said substrate covered with said coating comprising said first, second and third elements at an outlet of the device and heating the substrate to a temperature above 400° C. and below the softening point of the glass during step e).

14. The process as claimed in claim 1, in which the second constituent is selected from the group of metals consisting of: Ag, Ni, Cu, and Au.

* * * * *